United States Patent
Zhang et al.

(10) Patent No.: US 9,478,881 B2
(45) Date of Patent: Oct. 25, 2016

(54) SNAP CONNECTOR FOR SOCKET ASSEMBLY AND ASSOCIATED TECHNIQUES AND CONFIGURATIONS

(71) Applicant: Intel Corporation, Santa Clara, CA (US)

(72) Inventors: Zhichao Zhang, Chandler, AZ (US); Gaurav Chawla, Tempe, AZ (US); Rajasekaran Swaminathan, Chandler, AZ (US); Kemal Aygun, Chandler, AZ (US); Li Sun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/642,078

(22) Filed: Mar. 9, 2015

(65) Prior Publication Data
US 2016/0268710 A1    Sep. 15, 2016

(51) Int. Cl.
*H01R 13/193* (2006.01)
*H01R 12/51* (2011.01)
*H01R 12/70* (2011.01)
*H01R 43/20* (2006.01)

(52) U.S. Cl.
CPC ........ *H01R 12/7076* (2013.01); *H01R 43/205* (2013.01)

(58) Field of Classification Search
CPC .... H01R 13/193; H01R 12/51; H01R 12/52; H01R 12/7076; H05K 7/1007
See application file for complete search history.

(56) References Cited

U.S. PATENT DOCUMENTS

| | | | | |
|---|---|---|---|---|
| 5,556,293 A | * | 9/1996 | Pfaff | G01R 1/0483 439/259 |
| 5,880,590 A | * | 3/1999 | Desai | G01R 1/07314 174/261 |
| 5,947,751 A | * | 9/1999 | Massingill | G01R 1/0483 439/70 |
| 5,951,305 A | * | 9/1999 | Haba | H01R 9/091 439/426 |
| 6,283,782 B1 | * | 9/2001 | Yahiro | H01R 13/193 439/259 |

(Continued)

OTHER PUBLICATIONS

Gore® Snapshot® EMI Shields—Application Guide <http://www.gore.com/en_xx/products/electronic/emi/snapshot-application-guide.html> [retrieved on Jun. 23, 2015], 12 pages.

*Primary Examiner* — Gary Paumen
(74) *Attorney, Agent, or Firm* — Schwabe, Williamson & Wyatt, P.C.

(57) ABSTRACT

Embodiments of the present disclosure are directed towards a snap connector for socket assembly and associated techniques and configurations. In one embodiment, a socket assembly includes a socket body having a plurality of openings extending from a first side of the socket body to a second side of the socket body to provide an electrical pathway between the first side and the second side, the second side disposed opposite to the first side, wherein a holding portion of an individual opening of the plurality of openings adjacent to the first side of the socket body is shaped to hold a corresponding electrical contact of a die package by elastic force applied by the socket body to the electrical contact when the electrical contact is positioned within the holding portion. Other embodiments may be described and/or claimed.

21 Claims, 5 Drawing Sheets

(56) References Cited

U.S. PATENT DOCUMENTS

| | | | | |
|---|---|---|---|---|
| 6,501,665 B1* | 12/2002 | Ted | ................ | H05K 3/3426 174/257 |
| 6,648,654 B1* | 11/2003 | Akram | ................ | H01R 13/2421 439/70 |
| 7,104,804 B2* | 9/2006 | Batinovich | ......... | H01L 21/4853 257/E21.508 |
| 7,121,858 B2* | 10/2006 | Chen | ................ | G01R 1/0433 439/259 |
| 7,121,860 B2* | 10/2006 | Cram | ................ | H01R 13/62905 439/264 |
| 7,442,045 B1* | 10/2008 | Di Stefano | ............ | H01R 4/027 439/439 |
| 2008/0020603 A1* | 1/2008 | Hougham | ............ | H05K 3/326 439/71 |
| 2008/0194124 A1* | 8/2008 | Di Stefano | ........ | H01R 13/2407 439/66 |
| 2011/0076862 A1* | 3/2011 | Yeh | ................ | H01R 13/2457 439/70 |

\* cited by examiner

SNAP CONNECTOR FOR SOCKET ASSEMBLY AND ASSOCIATED TECHNIQUES AND CONFIGURATIONS

FIELD

Embodiments of the present disclosure generally relate to the field of integrated circuits, and more particularly, to a snap connector for socket assembly and associated techniques and configurations.

BACKGROUND

A socket connector may be used to couple a die package with a circuit board. Currently, a socket connector may include ball-grid array (BGA), land-grid array (LGA), pin-grid array (PGA) and/or reflow-grid array (RGA) elements to provide a connection between a die package and the socket connector. However, rework for the BGA configuration may be extremely challenging, making the die package less flexible for swap, upgrade or inventory control in a final product. While the LGA and PGA configurations may facilitate removal of the die package from the socket connect, the LGA and PGA configurations typically have a higher profile (e.g., resulting in larger size), complicated loading fixtures and worse electrical performance than the BGA configuration. The RGA configuration is intended to provide a separable socket by embedding thermal heaters in the socket to facilitate removal of the die package by solder reflow. However, the RGA configuration increases the socket structural, manufacturing and assembly/disassembly complexity and risks.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
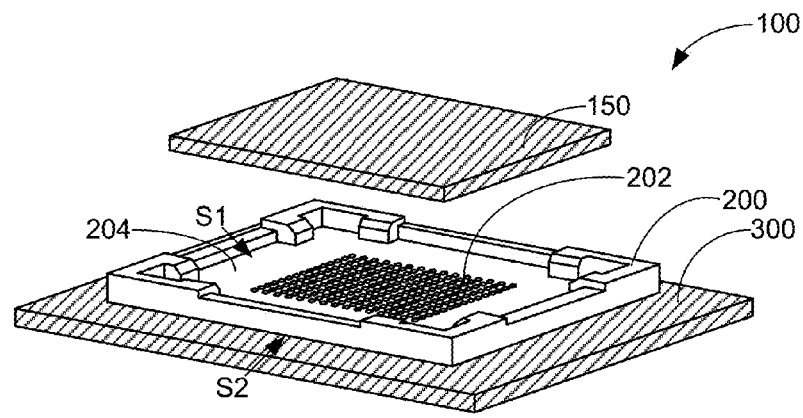
FIG. 1 schematically illustrates a perspective top view of an example integrated circuit (IC) assembly, in accordance with some embodiments.

Embodiments of the present disclosure describe a snap connector for socket assembly and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a perspective top view of an example integrated circuit (IC) assembly 100, in accordance with some embodiments. According to various embodiments, the IC assembly 100 may include a socket assembly 200 coupled with a circuit board 300 and/or a die or die package (hereinafter "die package 150") configured to couple with the socket assembly 200. In the depicted embodiment, the die package 150 is shown in a decoupled state from the socket assembly 200 to avoid obscuring aspects of the socket assembly 200. The die package 150 may be electrically coupled with the circuit board 300 through the socket assembly 200 in some embodiments.

The socket assembly 200 may include, for example, a plurality of openings 202 disposed in a socket body 204 (sometimes referred to as "socket housing") to provide an electrical pathway between a first side, S1, and a second side, S2, of the socket body 204. The first side S1 may be disposed opposite to the second side S2, as can be seen. The plurality of openings 202 may have respective holding portions (e.g., holding portion 202B of FIG. 3) that are shaped to hold corresponding electrical contacts of the die package 150 by elastic force as further described herein. The plurality of openings 202 may, for example, include a receptacle part of a snap-like mechanism that allows coupling and separation of the die package 150 with the socket assembly 200 by a mechanical force that overcomes the elastic holding force of the openings 202.

In some embodiments, the circuit board 300 may be a printed circuit board (PCB) composed of an electrically insulative material such as an epoxy laminate. The circuit board 300 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die package 150 through the circuit board 300. The circuit board 300 may be composed of other suitable materials in other embodiments. For example, in some embodiments, the circuit board 300 is an epoxy-based laminate substrate having a core and/or build-up layers such as, for example, an Ajinomoto Build-up Film (ABF) substrate. In some embodiments, the circuit board 300 is a motherboard (e.g., motherboard 802 of FIG. 8).

The die package 150 may include one or more dies in any of a wide variety of suitable configurations. For example, the die package 150 may be a central processing unit (CPU) package in one embodiment. The die package 150 may include one or more dies that are encapsulated, at least partially, in a protective enclosure such as, for example, a mold compound or other suitable protective housing. In some embodiments, the die package 150 may include a heat spreading element such as, for example, an integrated heat spreader. In some embodiments, the die package 150 may include alignment features to facilitate coupling of the die package 150 with corresponding features of the socket assembly 200.

The die package 150 may include one or more dies made from a semiconductor material (e.g., silicon) and having circuitry formed using semiconductor fabrication techniques such as thin film deposition, lithography, etching and the like used in connection with forming CMOS devices. In some embodiments, the one or more dies of the die package 150 may be, include, or be a part of a processor, memory, SoC or ASIC. In one embodiment, the die package 150 includes a central processing unit (CPU) of a computing device. The one or more dies in the die package 150 may include a wide variety of configurations including, for example, suitable combinations of flip-chip and/or wire-bonding configurations, interposers, multi-chip package configurations including system-in-package (SiP) and/or package-on-package (PoP) configurations.

Figure 2:
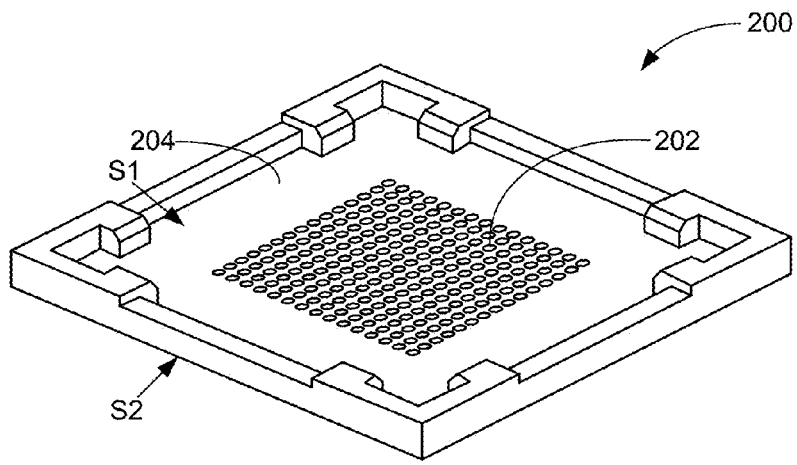
FIG. 2 schematically illustrates a perspective top view of a socket assembly, in accordance with some embodiments.
Figure 3:
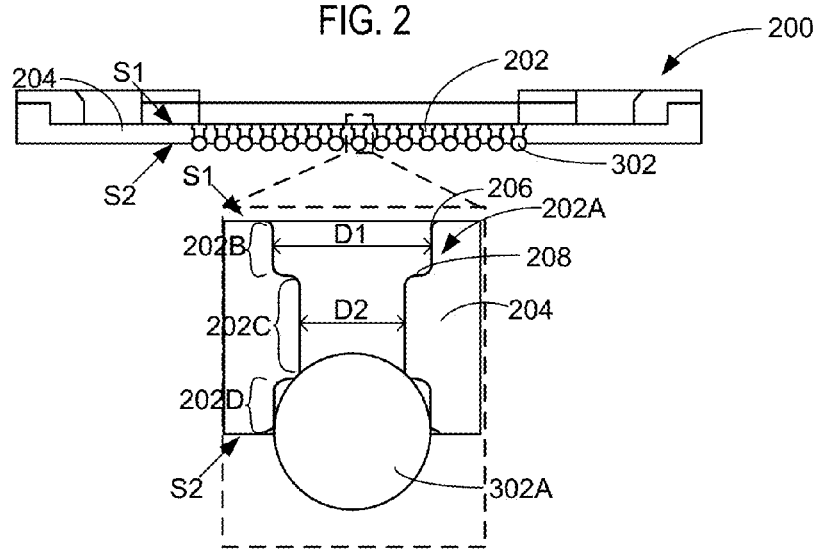
FIG. 3 schematically illustrates a cross-section side view of a socket assembly and an exploded view of an opening of the socket assembly, in accordance with some embodiments.

FIG. 2 schematically illustrates a perspective top view of a socket assembly 200, in accordance with some embodiments. FIG. 3 schematically illustrates a cross-section side view of a socket assembly 200 and an exploded view of an opening 202A of the socket assembly 200, in accordance with some embodiments. The socket assembly 200 of FIG. 2 or 3 may comport with embodiments described in connection with the socket assembly 200 of FIG. 1 and vice versa.

Referring to FIGS. 2 and 3, according to various embodiments, the socket assembly 200 may include a socket body 204 having a plurality of openings 202 formed through the socket body 204. In some embodiments, the socket body 204 may be composed, at least in part, of an elastic, electrically insulative material such as, for example, a polymer. In some embodiments, the polymer may include an elastomer such as, for example, silicone with a metal (e.g., silicone+AuCo plated Ni or silicone+Au powder). The polymer may include other suitable materials in other embodiments. The polymer may be part of the socket body 204 adjacent to a holding portion 202B of the plurality of openings 202 in some embodiments.

In some embodiments, multiple or each of the plurality of openings 202 may be configured to serve as a receptacle of a snap mechanism to hold corresponding electrical contacts of a die package. For example, in the exploded view of FIG. 3, the opening 202A may include a holding portion 202B adjacent to the first side S1 of the socket body 204. The holding portion 202B may be shaped to hold a corresponding electrical contact of a die package by elastic force applied by material of the socket body 204 to the electrical contact when the electrical contact is positioned within the holding portion 202B. For example, the holding portion 202B may have a dimension such as, for example, diameter D1 that is smaller than a corresponding dimension (e.g., diameter) of an electrical contact (e.g., a ball structure) that is pressed into place within the holding portion 202B to cause the elastic material of the socket body 204 to stretch such that an elastic restoration force of the stretched elastic material causes sidewalls of the opening 202A in the holding portion 202B to grip and hold the electrical contact in place.

In some embodiments, the elastic material of the socket body 204 may only be disposed adjacent to the holding portion 202B. For example, a layer of the elastic material may be formed adjacent to the first side S1 and the holding portion 202B. In other embodiments, the socket body 204 may be primarily or entirely composed of the elastic material.

In some embodiments, each or multiple of the plurality of openings 202 may be plated with a metal as depicted, for example, in connection with opening 202A. For example, in some embodiments, the plurality of openings 202 may include plated through-holes (PTHs). The metal 206 may include any suitable metal including, for example, gold (Au). The metal 206 may be composed of other suitable metals in other embodiments.

The socket body 204 may be plated with a metal 206 within the plurality of openings 202 such that the metal 206 is in contact with the electrical contact when the electrical contact is positioned within the holding portion 202B. According to various embodiments, the metal 206 in the opening 202A may be configured to provide an electrical pathway between the first side S1 and the second side S2 of the socket body 204.

The metal 206 may be plated to provide a thickness that does not interfere with the elasticity and holding force of the holding portion 202B. For example, in some embodiments, the metal 206 may have a substantially uniform thickness ranging from 1 micron to 5 microns. The metal 206 may have other suitable thicknesses in other embodiments.

In some embodiments, the holding portion 202B of the opening 202A may have a wider opening than an intermediate or middle portion 202C of the opening 202A, as can be seen. For example, the diameter D1 of the holding portion 202B may be greater than a diameter D2 of the middle portion 202C, which may provide a support structure 208 of the socket body 204 to mechanically support or provide a hard-stop to the electrical contact when the electrical contact is seated in the holding portion 202B.

According to some embodiments, each or multiple of the plurality of openings 202 may include a contact portion 202D adjacent to the second side S2 of the socket body 204. The contact portion 202D may be shaped to receive and/or couple with an electrical contact 302A of a plurality of electrical contacts 302 of an external component such as a circuit board (e.g., circuit board 300 of FIG. 1), server switch or other electrical interface. For example, in some embodiments, the contact portion 202D may be shaped to receive a solder contact such as a solder ball of a ball-grid array (BGA) configuration. In other embodiments, the contact portion 202D may be another holding portion similar to the previously described holding portion 202B and may be shaped to hold the electrical contact 302A by elastic force applied by the socket body 204 to the electrical contact 302A when the second electrical contact is positioned within the other holding portion. Providing another holding portion in the contact portion 202D may facilitate removal of the electrical contact 302A from the contact portion 202D by mechanical force only (e.g., pulling apart without using a reflow process). In this regard, the snap mechanism of the holding portion(s) may provide a separable connection to facilitate swapping out the die package 150 and/or circuit board for upgrade and/or inventory control. Providing a holding portion 202B and contact portion 202D that also serves as a holding portion may increase board reusability and efficiency in testing processes.

Figure 4:
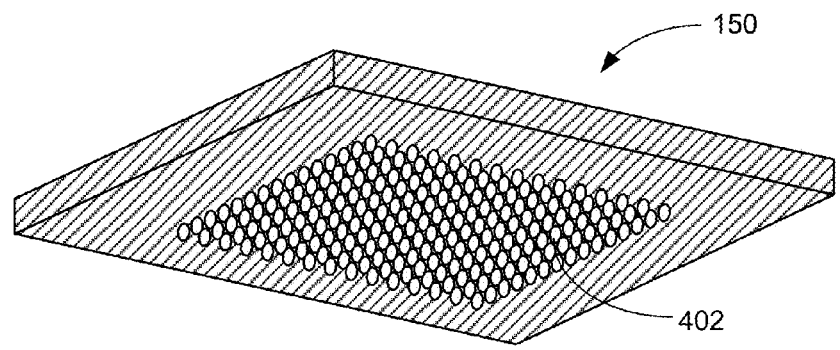
FIG. 4 schematically illustrates a perspective bottom view of a die package having a plurality of electrical contacts, in accordance with some embodiments.

FIG. 4 schematically illustrates a perspective bottom view of a die package 150 having a plurality of electrical contacts 402, in accordance with some embodiments. Referring to FIGS. 2-4, according to various embodiments, individual electrical contacts of the plurality of electrical contacts 402 may correspond with individual openings of the plurality of openings 202. For example, the plurality of electrical contacts 402 may have a male-mating structure (e.g., a protrusion) that is configured to snap together with a female-mating structure (e.g., a receptacle) of the plurality of openings 202. The male-mating structure of the electrical contacts 402 may have a wide variety of shapes including, for example, pins, beams, or balls. The female-mating structure of the plurality of openings 202 may have a wide variety of corresponding shapes to accommodate the male-mating structure of the electrical contacts 402 in a snap-fastening manner. In the depicted embodiment, the electrical contacts 402 are balls, which may allow the die package 150 to include balls in a BGA-type configuration.

In some embodiments, the electrical contacts 402 may be composed of a substantially rigid, electrically conductive material such as a metal. For example, in some embodiments, the electrical contacts 402 may be composed of gold-plated copper structures such as balls. The electrical contacts 402 may be composed of other suitable electrically conductive materials in other embodiments.

Figure 5A:
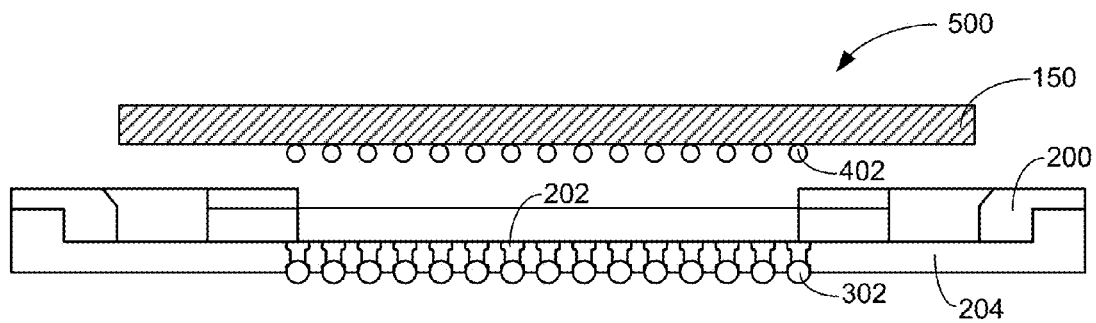
FIG. 5A schematically illustrates a cross-section side view of an IC assembly prior to coupling the die package with the socket assembly, in accordance with some embodiments.
Figure 5B:
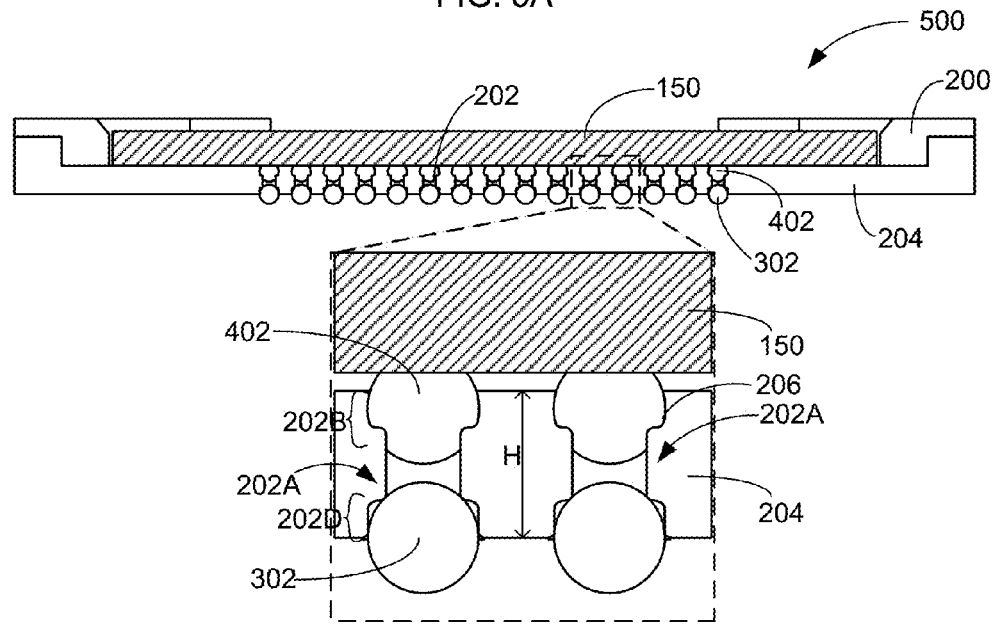
FIG. 5B schematically illustrates a cross-section side view of the IC assembly of FIG. 5A subsequent to coupling the die package with the socket assembly and an exploded view of individual openings of the socket assembly holding the electrical contacts of the die package, in accordance with some embodiments.

FIG. 5A schematically illustrates a cross-section side view of an IC assembly 500 prior to coupling the die package 150 with the socket assembly 200, in accordance with some embodiments. FIG. 5B schematically illustrates a cross-section side view of the IC assembly 500 of FIG. 5A subsequent to coupling the die package 150 with the socket assembly 200 and an exploded view of individual openings 202A of the socket assembly 500 holding the electrical contacts 402 of the die package 150, in accordance with some embodiments. The individual openings 202A may comport with embodiments described in connection with opening 202A of FIG. 3. According to various embodiments, the die package 150 may be electrically and mechanically coupled with the socket assembly 200 by pressing the electrical contacts 402 of the die package 150 into the holding portion 202B of the individual openings 202A such that an elastic force applied by material of the socket body 204 holds the electrical contacts 402.

In some embodiments, the holding portion 202B may allow removal of the electrical contacts 402 by mechanical force. For example, the holding portion 202B may be designed in a manner that allows the holding force to be less than a ball pull strength such that the die package 150 and the socket assembly 200 can be decoupled by only pulling them apart (e.g., without reflow process) without damaging each of the die package 150 and the socket assembly 200. For example, the die package 150 may be readily removed and attached multiple times as desired. In some embodiments, a loading mechanism may be used to ensure or maintain electrical connection between the electrical contacts 402 and the metal 206 in the openings 202A. Such loading mechanism may deliver a lower load relative to a loading mechanism for LGA or PGA sockets because the die package 150 may be primarily held in place by friction between the electrical contacts 402 and the holding portion 202B of the openings 202A. The loading mechanism may be a simple mechanism added around the die package 150 and the socket assembly 200, which may simplify loading fixture design, reduce a keep-out-zone (KOZ) on the circuit board and save cost associated with an independent loading mechanism (ILM) relative to LGA or PGA sockets.

In some embodiments, electrical contacts 302 of another external component (e.g., a circuit board) may be coupled with corresponding contact portions 202D of the plurality of openings 202. The electrical contacts 302 and contact portions 202D may comport with embodiments described in connection with FIGS. 2 and 3.

According to various embodiments, each or multiple of the plurality of openings 202 may be configured in a BGA configuration to facilitate coupling of the socket assembly 200 with BGA packages (e.g., die package 150 or circuit board 300). BGA packages may have lower profile, lower crosstalk performance and lower cost relative to other types of packages such as LGA, PGA and/or RGA packages. The electrical performance of the snap configuration may be improved relative to LGA or other current configurations. Providing a snap mechanism such as the holding portion 202B in the socket body 204 may provide significant cost savings for a variety of reasons. For example, the snap mechanism may eliminate a need for a design of a loading mechanism such as an ILM that may be used for LGA/PGA configurations. The snap mechanism may also be a potential low cost testing socket solution in Processor Platform Validation (PPV) testing compared with more costly po-go pin based design. The snap mechanism may further open up space around the socket openings for accommodation of additional components. In some embodiments, the socket assembly 200 with snap mechanism may provide an IC assembly 500 having a much lower height profile than other IC assemblies that use other socket assemblies (e.g., LGA or PGA sockets). For example, in some embodiments, a height H of the socket assembly 200 across the socket body 204 may be less than or equal to 1 millimeter (mm) compared with a height of 2.5 mm or greater for an LGA socket.

Figure 6:
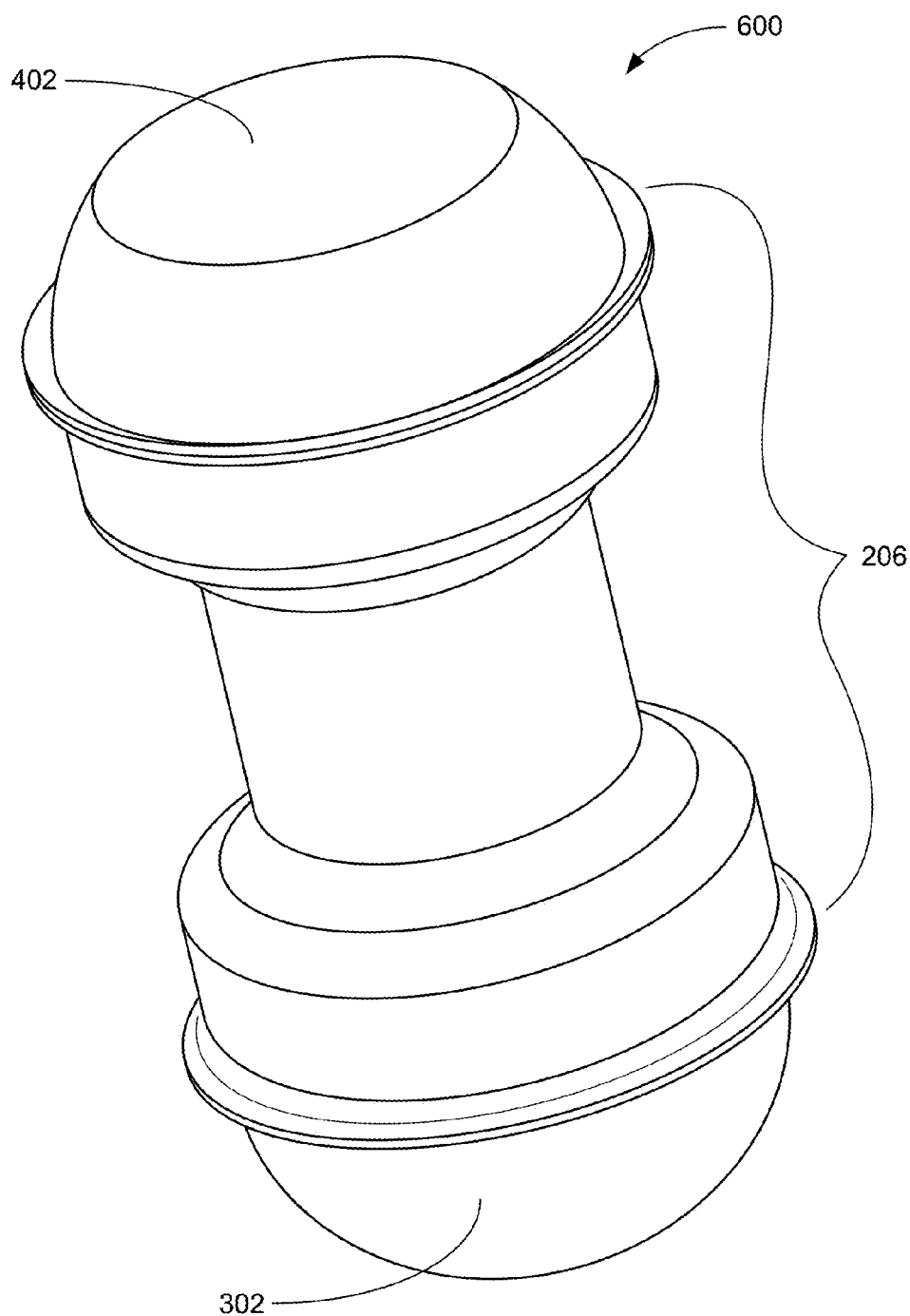
FIG. 6 schematically illustrates a perspective view of an example configuration of a socket connector of an individual opening of a socket assembly, in accordance with some embodiments.

FIG. 6 schematically illustrates a perspective view of an example configuration of a socket connector 600 of an individual opening (e.g., opening 202A of FIG. 3) of a socket assembly (e.g., socket assembly 200 of FIGS. 1-3, 5a-b), in accordance with some embodiments. The socket connector 600 may include metal 206 that lines the sidewalls of the socket body within the openings, an electrical contact 402 of the die package and an electrical contact 302 of another external component such as a circuit board. The electrical contacts 302, 402 may be configured to mechanically snap into the respective holding portion of the metal 206, as can be seen. In some embodiments, one of the electrical contacts 302, 402 may be composed of solder that is reflowed to form a solder joint.

The socket connector 600 represents geometry for one example configuration and can include other suitable geometries in other embodiments. In some embodiments, a conductive material such as conductive polymer may be deposited to fill the gap between the electrical contacts 302, 402 (e.g., in the middle portion 202C of openings 202A of FIG. 5B) to improve conductivity and/or reliability.

Figure 7:
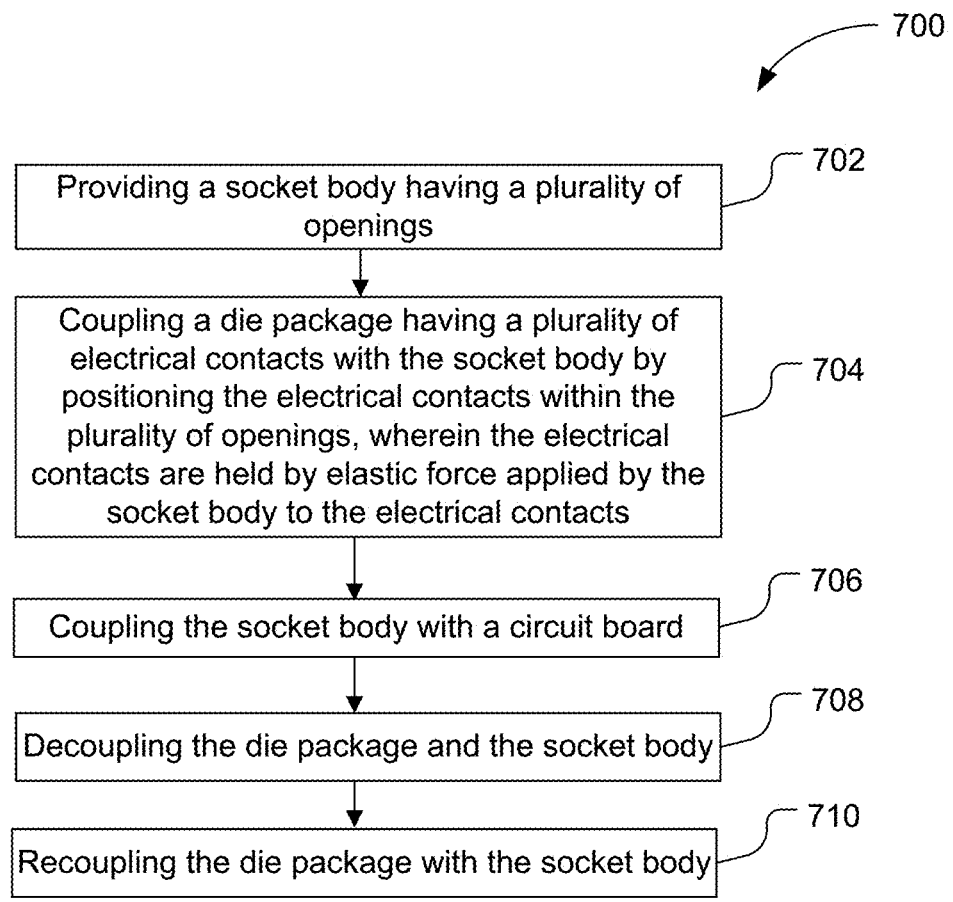
FIG. 7 schematically illustrates a flow diagram for a method of fabricating an IC assembly, in accordance with some embodiments.

FIG. 7 schematically illustrates a flow diagram for a method 700 of fabricating an IC assembly (e.g., IC assembly 100 of FIG. 1), in accordance with some embodiments. The method 700 may comport with embodiments described in connection with FIGS. 1-6 and vice versa.

At 702, the method 700 may include providing a socket body (e.g., socket body 204 of FIGS. 1-3, 5A-B) having a plurality of openings (e.g., plurality of openings 202 of FIGS. 1-3, 5A-B). The openings may be configured with holding portions to receive respective electrical contacts of a die package and an external component such as a circuit board as described herein.

At 704, the method 700 may include coupling a die package (e.g., die package 150 of FIGS. 4, 5A-B) having a plurality of electrical contacts (e.g., electrical contacts 402 of FIGS. 1, 4, 5A-B) with the socket body by positioning the electrical contacts within the plurality of openings, wherein the electrical contacts are held by elastic force applied by the socket body to the electrical contacts. For example, the electrical contacts of the die package may be pressed and snapped into place within respective holding portions of the plurality of openings.

At 706, the method 700 may include coupling the socket body with a circuit board (e.g., circuit board 300 of FIG. 1). The circuit board may include electrical contacts (e.g., electrical contacts 302 of FIGS. 3 and 5A-B) that are configured to electrically couple with a contact portion (e.g., contact portion 202D of FIGS. 3 and 5B) of the openings in the socket body. In some embodiments, the contact portion may be configured to receive a solder ball that is reflowed to form a solder joint. For example, the circuit board may be coupled with the socket body such that solder contacts are disposed within the contact portion of the openings. In other embodiments, the contact portion may be another holding portion that is configured to provide a snap fastening mechanism with the electrical contact of the circuit board.

At 708, the method 700 may include decoupling the die package and the socket body. In some embodiments, the decoupling may be performed by only applying a mechanical force (e.g., pulling apart).

At 710, the method 700 may include recoupling the die package with the socket body. In some embodiments, the recoupling may be performed by only applying a mechanical force (e.g., pressing together).

Various operations are described as multiple discrete operations in turn, in a manner that is most helpful in understanding the claimed subject matter. However, the order of description should not be construed as to imply that these operations are necessarily order dependent.

Figure 8:
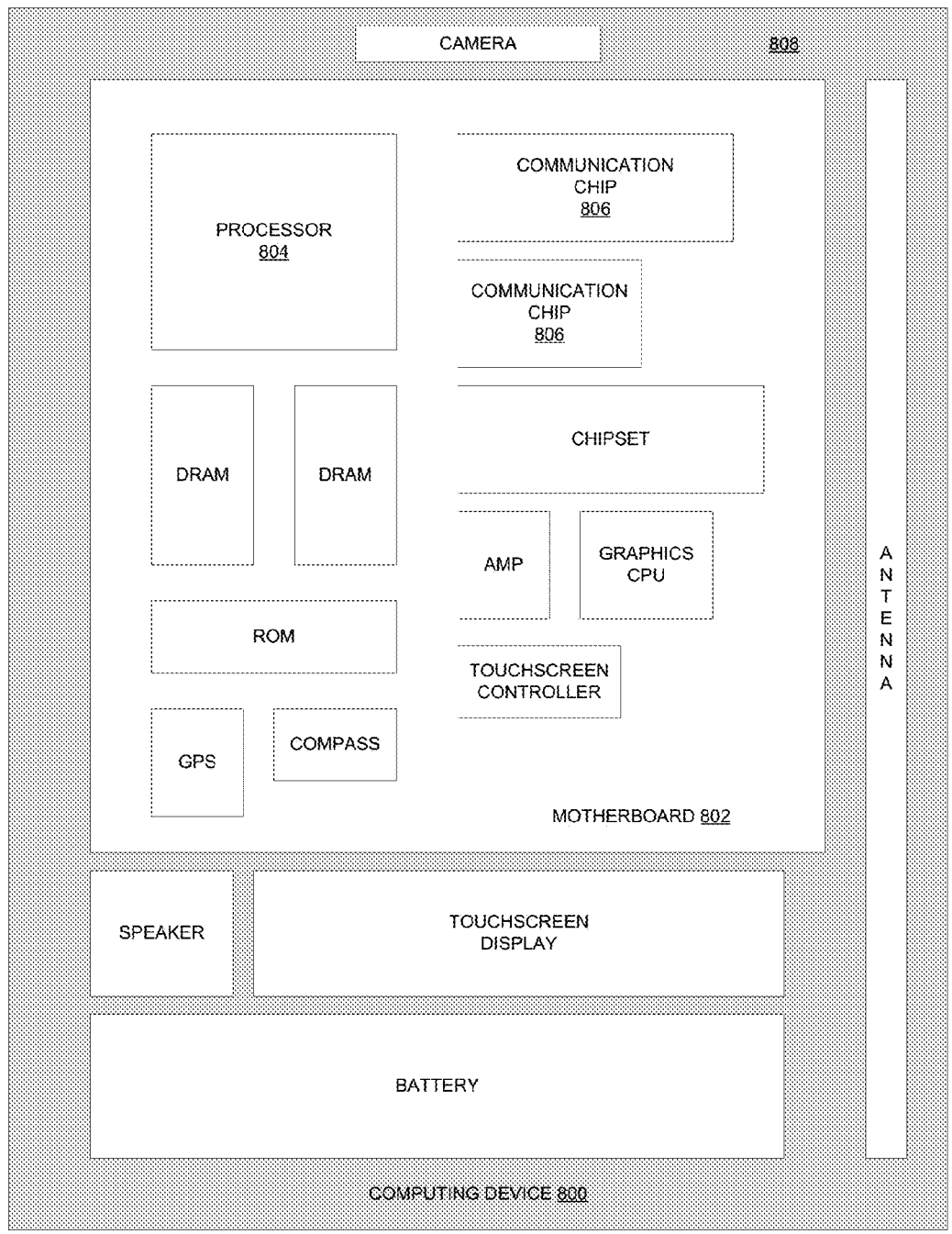
FIG. 8 schematically illustrates a computing device that includes an IC assembly as described herein, in accordance with some embodiments.

Embodiments of the present disclosure may be implemented into a system using any suitable hardware and/or software to configure as desired. FIG. 8 schematically illustrates a computing device 800 that includes an IC assembly (e.g., IC assembly 100 of FIG. 1 or socket assembly 200 of FIG. 2) as described herein, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

The processor 804 of the computing device 800 may be packaged in an IC package assembly (e.g., IC assembly 100 of FIG. 1) as described herein. For example, the circuit board 300 of FIG. 1 may be a motherboard 802 and the processor 804 may be a die of the die package 150 that is coupled with a socket assembly 200 mounted on the circuit board 300 according to techniques and configurations described herein. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 806 may also include a die that may be packaged in an IC package assembly (e.g., IC assembly 100 of FIG. 1) as described herein. In further implementations, another component (e.g., memory device or other integrated circuit device) housed within the computing device 800 may include a die that may be packaged in an IC package assembly (e.g., IC assembly 100 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

According to various embodiments, the present disclosure describes a socket assembly. Example 1 of a socket assembly may include a socket body having a plurality of openings extending from a first side of the socket body to a second side of the socket body to provide an electrical pathway between the first side and the second side, the second side disposed opposite to the first side, wherein a holding portion of an individual opening of the plurality of openings adjacent to the first side of the socket body is shaped to hold a corresponding electrical contact of a die package by elastic force applied by the socket body to the electrical contact when the electrical contact is positioned within the holding portion. Example 2 may include the socket assembly of Example 1, wherein the socket body is plated with a metal within the plurality of openings such that the metal is in contact with the electrical contact when the electrical contact is positioned within the holding portion. Example 3 may include the socket assembly of Example 1, wherein the holding portion has a wider opening than a middle portion of the individual opening that is closer to the second side of the socket body than the holding portion. Example 4 may include the socket assembly of Example 1, wherein the individual opening further comprises a contact portion adjacent to the second side of the socket body that is shaped to receive a solder contact of a circuit board. Example 5 may include the socket assembly of Example 1, wherein the holding portion is a first holding portion, the electrical contact is a first electrical contact, and the individual opening further comprises a second holding portion adjacent to the second side of the socket body that is shaped to hold a corresponding second electrical contact of a circuit board by elastic force applied by the socket body to the second electrical contact when the second electrical contact is positioned within the second holding portion. Example 6 may include the socket assembly of any of Examples 1-5, wherein the holding portion allows removal of the electrical contact from the holding portion by mechanical force. Example 7 may include the socket assembly of any of Examples 1-5, wherein the plurality of openings are configured in a ball-grid array (BGA) configuration. Example 8 may include the socket assembly of any of Examples 1-5, wherein the socket body adjacent to the holding portion is composed of a polymer.

According to various embodiments, the present disclosure describes an integrated circuit (IC) assembly. Example 9 of an IC assembly may include a socket body having a plurality of openings extending from a first side of the socket body to a second side of the socket body to provide an electrical pathway between the first side and the second side, the second side disposed opposite to the first side and a die package coupled with the socket body, wherein an electrical contact of the die package is positioned within a holding portion of an individual opening of the plurality of openings adjacent to the first side of the socket body that is shaped to hold the electrical contact by elastic force applied by the socket body to the electrical contact. Example 10 may include the IC assembly of Example 9, wherein the socket body is plated with a metal within the plurality of openings such that the metal is in contact with the electrical contact. Example 11 may include the IC assembly of Example 9, wherein the holding portion has a wider opening than a middle portion of the individual opening that is closer to the second side of the socket body than the holding portion. Example 12 may include the IC assembly of any of Examples 9-11, wherein the individual opening further comprises a contact portion adjacent to the second side of the socket body that is shaped to receive a solder contact of a circuit board, the IC assembly further comprising the circuit board having the solder contact, wherein the solder contact is disposed within the contact portion of the individual opening. Example 13 may include the IC assembly of any of Examples 9-11, wherein the holding portion is a first holding portion, the electrical contact is a first electrical contact, and the individual opening further comprises a second holding portion adjacent to the second side of the socket body that is shaped to hold a corresponding second electrical contact of a circuit board, the IC assembly further comprising the circuit board having the second electrical contact, wherein the second electrical contact is positioned within the second holding portion and held by elastic force applied by the socket body to the second electrical contact. Example 14 may include the IC assembly of any of Examples 9-11, wherein the electrical contact is a metal ball.

According to various embodiments, the present disclosure describes a method. Example 15 of a method of fabricating an integrated package assembly may include providing a socket body having a plurality of openings extending from a first side of the socket body to a second side of the socket body to provide an electrical pathway between the first side and the second side, the second side disposed opposite to the first side and coupling a die package with the socket body by positioning an electrical contact of the die package within a holding portion of an individual opening of the plurality of openings adjacent to the first side of the socket body that is shaped to hold the electrical contact, wherein the electrical contact is held by elastic force applied by the socket body to the electrical contact. Example 16 may include the method of Example 15, wherein the socket body is plated with a metal within the plurality of openings such that the metal is in contact with the electrical contact subsequent to positioning the electrical contact within the holding portion of the individual opening. Example 17 may include the method of Example 15, wherein the holding portion has a wider opening than a middle portion of the individual opening that is closer to the second side of the socket body than the holding portion. Example 18 may include the method of Example 15, wherein the individual opening further comprises a contact portion adjacent to the second side of the socket body that is shaped to receive a solder contact of a circuit board, the method further comprising coupling the circuit board with the socket body such that the solder contact is disposed within the contact portion of the individual opening. Example 19 may include the method of Example 15, wherein the holding portion is a first holding portion, the electrical contact is a first electrical contact, and the individual opening further comprises a second holding portion adjacent to the second side of the socket body that is shaped to hold a corresponding second electrical contact of a circuit board, the method further comprising coupling the circuit board having the second electrical contact with the socket body by positioning the second electrical contact within the second holding portion, wherein the second electrical contact is held by elastic force applied by the socket body to the second electrical contact. Example 20 may include the method of any of Examples 15-19, further comprising decoupling the die package from the socket body by only applying a mechanical force. Example 21 may include the method of Example 20, further comprising recoupling the die package to the socket body by positioning the electrical contact of the die package within the holding portion of the individual opening, wherein the electrical contact is held by elastic force applied by the socket body to the electrical contact.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A socket assembly comprising:
  a socket body having a plurality of openings extending from a first side of the socket body to a second side of the socket body to provide an electrical pathway between the first side and the second side, the second side disposed opposite to the first side, wherein a first holding portion of a first individual opening of the plurality of openings adjacent to the first side of the socket body is shaped to hold a first corresponding electrical contact of a die package by elastic force applied by the socket body to the first electrical contact when the first electrical contact is positioned within the first holding portion, wherein a second holding portion of a second individual opening of the plurality of openings adjacent to the first side of the socket body is shaped to hold a second corresponding electrical contact of the die package by elastic force applied by the socket body to the second electrical contact when the second electrical contact is positioned within the second holding portion, and wherein the socket body adjacent to the first and second holding portions includes a polymer that surrounds each of the first and second holding portions and extends continuously between the first and second holding portions.

2. The socket assembly of claim 1, wherein the socket body is plated with a metal within the plurality of openings such that the metal is in contact with the electrical contact when the electrical contact is positioned within the holding portion.

3. The socket assembly of claim 1, wherein the holding portion has a wider opening than a middle portion of the individual opening that is closer to the second side of the socket body than the holding portion.

4. The socket assembly of claim 1, wherein the individual opening further comprises:
a contact portion adjacent to the second side of the socket body that is shaped to receive a solder contact of a circuit board.

5. The socket assembly of claim 1, wherein the holding portion is a first holding portion, the electrical contact is a first electrical contact, and the individual opening further comprises:
a second holding portion adjacent to the second side of the socket body that is shaped to hold a corresponding second electrical contact of a circuit board by elastic force applied by the socket body to the second electrical contact when the second electrical contact is positioned within the second holding portion.

6. The socket assembly of claim 1, wherein the holding portion allows removal of the electrical contact from the holding portion by mechanical force.

7. The socket assembly of claim 1, wherein the plurality of openings are configured in a ball-grid array (BGA) configuration.

8. The socket assembly of claim 1, wherein the polymer continuously extends from the first side of the socket body to the second side of the socket body between the first and second holding portions.

9. An integrated circuit (IC) assembly comprising:
a socket body having a plurality of openings extending from a first side of the socket body to a second side of the socket body to provide an electrical pathway between the first side and the second side, the second side disposed opposite to the first side, wherein the socket body includes a polymer material; and
a die package coupled with the socket body, wherein an electrical contact of the die package is positioned within a holding portion of an individual opening of the plurality of openings adjacent to the first side of the socket body that is shaped to hold the electrical contact by elastic force applied by the polymer material of the socket body to the electrical contact, wherein the polymer material surrounds the holding portion and extends continuously between a plurality of the plurality of openings.

10. The IC assembly of claim 9, wherein the socket body is plated with a metal within the plurality of openings such that the metal is in contact with the electrical contact.

11. The IC assembly of claim 9, wherein the holding portion has a wider opening than a middle portion of the individual opening that is closer to the second side of the socket body than the holding portion.

12. The IC assembly of claim 9, wherein the individual opening further comprises a contact portion adjacent to the second side of the socket body that is shaped to receive a solder contact of a circuit board, the IC assembly further comprising:
the circuit board having the solder contact, wherein the solder contact is disposed within the contact portion of the individual opening.

13. The IC assembly of claim 9, wherein the holding portion is a first holding portion, the electrical contact is a first electrical contact, and the individual opening further comprises a second holding portion adjacent to the second side of the socket body that is shaped to hold a corresponding second electrical contact of a circuit board, the IC assembly further comprising:
the circuit board having the second electrical contact, wherein the second electrical contact is positioned within the second holding portion and held by elastic force applied by the socket body to the second electrical contact.

14. The IC assembly of claim 9, wherein the electrical contact is a metal ball.

15. A method of fabricating an integrated package assembly comprising:
providing a socket body having a plurality of openings extending from a first side of the socket body to a second side of the socket body to provide an electrical pathway between the first side and the second side, the second side disposed opposite to the first side, wherein the socket body includes a polymer material; and
coupling a die package with the socket body by positioning an electrical contact of the die package within a holding portion of an individual opening of the plurality of openings adjacent to the first side of the socket body that is shaped to hold the electrical contact, wherein the electrical contact is held by elastic force applied by the polymer material of the socket body to the electrical contact, wherein the polymer material surrounds the holding portion and extends continuously between a plurality of the plurality of openings.

16. The method of claim 15, wherein the socket body is plated with a metal within the plurality of openings such that the metal is in contact with the electrical contact subsequent to positioning the electrical contact within the holding portion of the individual opening.

17. The method of claim 15, wherein the holding portion has a wider opening than a middle portion of the individual opening that is closer to the second side of the socket body than the holding portion.

18. The method of claim 15, wherein the individual opening further comprises a contact portion adjacent to the second side of the socket body that is shaped to receive a solder contact of a circuit board, the method further comprising:
coupling the circuit board with the socket body such that the solder contact is disposed within the contact portion of the individual opening.

19. The method of claim 15, wherein the holding portion is a first holding portion, the electrical contact is a first electrical contact, and the individual opening further comprises a second holding portion adjacent to the second side of the socket body that is shaped to hold a corresponding second electrical contact of a circuit board, the method further comprising:
coupling the circuit board having the second electrical contact with the socket body by positioning the second electrical contact within the second holding portion, wherein the second electrical contact is held by elastic force applied by the socket body to the second electrical contact.

20. The method of claim 15, further comprising:
decoupling the die package from the socket body by only applying a mechanical force.

21. The method of claim 20, further comprising:
recoupling the die package to the socket body by positioning the electrical contact of the die package within the holding portion of the individual opening, wherein the electrical contact is held by elastic force applied by the socket body to the electrical contact.

* * * * *